United States Patent [19]

Anderson

[11] Patent Number: 4,482,779
[45] Date of Patent: Nov. 13, 1984

[54] INELASTIC TUNNEL DIODES

[75] Inventor: Lynn M. Anderson, Lyndhurst, Ohio

[73] Assignee: The United States of America as represented by the Administrator of National Aeronautics and Space Administration, Washington, D.C.

[21] Appl. No.: 486,471

[22] Filed: Apr. 19, 1983

[51] Int. Cl.³ .............................................. H01L 31/06
[52] U.S. Cl. .................................... 136/255; 357/12; 357/30
[58] Field of Search ............... 136/243, 246, 252, 255, 136/256; 357/12, 30; 250/211 J, 212

[56] References Cited

U.S. PATENT DOCUMENTS

| | | | |
|---|---|---|---|
| 3,475,609 | 10/1969 | Schneider | 350/355 |
| 4,081,289 | 3/1978 | Campbell | 136/246 |
| 4,179,702 | 12/1979 | Lamorte | 357/30 |
| 4,206,002 | 6/1980 | Sabnis et al. | 136/249 TJ |
| 4,219,830 | 8/1980 | Gibbons | 357/30 |
| 4,251,679 | 2/1981 | Zwan | 136/244 |
| 4,377,722 | 3/1983 | Wested | 136/244 |

OTHER PUBLICATIONS

G. Cheek et al., "MIS and SIS Silicon Solar Cells: A Review", *Proceedings, 3rd. E. C. Photovoltaic Solar Energy Conf.*, (1980), Reidel Pub. Co., (1981), pp. 353-357.
R. Singh et al., "Tunnel MIS Solar Cells", *J. Vac. Sci. Technol.*, vol. 14, pp. 89-91, (1977).

*Primary Examiner*—Aaron Weisstuch
*Attorney, Agent, or Firm*—Norman T. Musial; John R. Manning

[57] ABSTRACT

Power is extracted from plasmons, photons, or other guided electromagnetic waves at infrared to mid-ultraviolet frequencies by inelastic tunneling in metal-insulator-semiconductor-metal diodes. Inelastic tunneling produces power by absorbing plasmons to pump electrons to higher potential. Specifically, an electron from a semiconductor layer absorbs a plasmon and simultaneously tunnels across an insulator into a metal layer which is at higher potential. The diode voltage determines the fraction of energy extracted from the plasmons; any excess is lost to heat.

18 Claims, 1 Drawing Figure

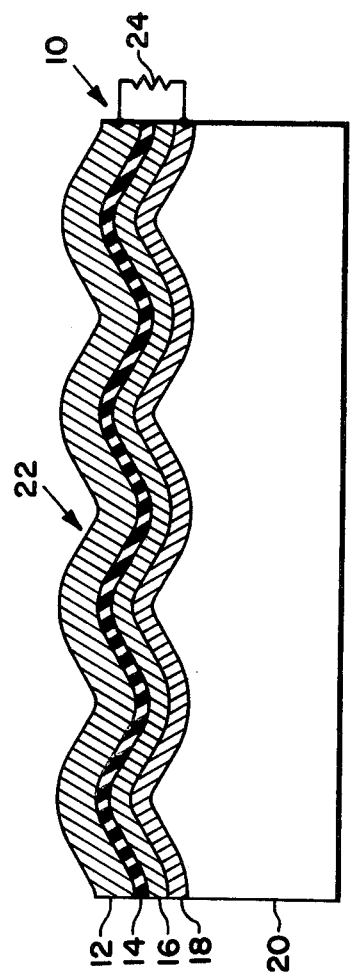

INELASTIC TUNNEL DIODES

ORIGIN OF THE INVENTION

The invention described herein was made by an employee of the United States Government and may be manufactured and used by or for the Government for governmental purposes without the payment of any royalties thereon or therefor.

TECHNICAL FIELD

This invention is concerned with tunable energy conversion diodes based on inelastic tunneling in metal-insulator-semiconductor-metal (MISM) films. The diodes extract power from photons, plasmons, or other guided electromagnetic waves at infrared to mid-ultraviolet frequencies.

Unlike semiconductor devices, inelastic tunnel diodes can be optimized for efficient energy conversion at different frequencies without changing materials. More particularly, by varying the load, or the geometry, it is possible to extract more energy from the higher frequency waves. Such versatility makes these diodes valuable components of many electro-optical systems, such as new classes of solar and laser energy converters, optical information processors, broadband photodetectors, and spectrum analyzers. Copending patent application Ser. No. 486,470 discloses an improved apparatus for efficient solar energy conversion which utilizes an array of these diodes to extract power from a spectrum of surface plasmons excited by sunlight.

A new and novel function of the diode is to extract energy from plasmons which are a type of guided electromagnetic wave that can be excited on the surface of a conductor having a negative dielectric constant. Thin films of common metals, such as aluminum or silver, can support a continuous spectrum of relativistic surface plasmons at infrared to ultraviolet frequencies. By way of illustration, the valence electrons in the metal can be thought of as a free electron gas moving within a stationary lattice of positive ions. The surface plasmons are oscillations in this gas. More particularly, these plasmons are regions of high and low electron density which propagate along the metal surface carrying energy in the form of electromagnetic fields. These guided waves are of technological importance because the electric fields are highly concentrated above the metal surface in close proximity thereto. Therefore, many electro-optic effects are enhanced by orders of magnitude when surface plasmons are used instead of ordinary light-beams. Also, the group and phase velocities are relativistic over most of the entire spectrum, providing for rapid signal processing.

A closely related plasmon, referred to as a junction plasmon, plays a central role in this energy conversion. This "slow mode" guides energy through the central regions of a metal-insulator-semiconductor-metal (MISM) film, where the strong localized fields can accelerate electrons across the thin insulating layer. The inelastic tunneling process absorbs plasmons to pump electrons to higher potential, enabling them to do work on the load. The function of the semiconductor is to prevent backflow.

Light and plasmons play complementary roles in an integrated optics system. Light is converted to plasmons easily and efficiently by using prisms or gratings, as described in copending patent application, Ser. No. 486,470. Ninety-nine percent conversion is frequently reported for monochromatic, collimated, polarized light in optimized structures, and the coherence of laser sources is fully preserved. Guided light is useful for long range energy transport, usually through fiber optic cables. Plasmons, on the other hand, are quickly dissipated by ohmic losses, and can only travel a few microns in the ultraviolet up to a few centimeters at infrared wavelengths. However, the plasma waves concentrate electromagnetic energy at a metal surface or within a diode which can enable electrical, electro-optical, or photochemical interactions to occur more readily. The diodes of the present invention use plasmons to convert electromagnetic energy to electrical power thereby providing a critical interface between optical and electrical circuits.

Conventional semiconductor devices cannot be used for these applications because semiconductor p-n junctions can only respond to photons with energy greater than the bandgap; excess excitation energy is lost to heat. Thus, different materials are required to extract maximum power from light of different frequencies and to change the cut-off frequency for photodetection. New materials generally require lengthy development times. Also, at certain frequencies, the semiconductor options are scarce, toxic, or unsatisfactory because of poor materials quality. Even when related alloys can be used for energy conversion across a frequency band, different diodes may not be compatible on the same substrate because the lattice constant and thermal expansion coefficient vary with composition.

Point-contact diodes also may be used to extract energy. These diodes have been incorporated in energy conversion rectennas at submillimeter and infrared frequencies. These devices are metal-barrier-metal, or semiconductor, diodes which rectify fluctuating currents by conventional tunneling that does not involve surface plasmons. Such diodes are objectionable because small contact areas are required to reduce the RC time constant of the circuit for high frequency operation. Conventional cat's whisker diodes have not been reproducible or stable for more than a few hours because of the small contact area. Microfabrication techniques are becoming available for improved devices. However, optical frequency rectification remains beyond the state of the art.

BACKGROUND ART

Concurrently filed copending patent application Ser. No. 486,470, which is entitled "Solar Energy Converter Using Surface Plasma Waves", the subject matter of which is hereby incorporated by reference, describes surface plasmon properties and coupling techniques suitable for solar energy conversion. Reference is made to the patents and other materials cited in the above mentioned patent application for discussion of other prior art techniques of possible interest.

Conventional semiconductor solar cells are covered by U.S. Pat. No. 4,219,830 to Gibbons. The semiconductor solar cell described in this patent has an electric field directed from the surface of the cell towards the center of the body such that minority carriers tend to drift away from the surface of the cell body. The cell has a graded p-type layer extending from all surfaces into the body or interior of the cell. An electric field is generated by the graded surface to the body regions, and the effect of this field forces electrons to drift to the interior of the cell so that holes drift to the heavily doped cell surface. As pointed out in copending application Ser. No. 486,470, over 50% of the incident power on such a solar cell will be wasted because of the mismatch between the broad solar spectrum and the monoenergetic conduction electrons which transport energy within the cell.

Sabnis et al U.S. Pat. No. 4,206,002 describes a solar cell having a gradually changing chemical composition which produces a gradually changing bandgap within the cell. Different sections of the cell have different bandgaps to enable the cell to absorb many different ranges of photon energy. The cell can convert several photon wavelengths or energy ranges into electrical energy.

Lamorte U.S. Pat. No. 4,179,702 discloses a monolithic cascade solar cell structure in which the junctions within the first and second energy converting layers are homojunctions, but the third layer provides a homojunction operating as a tunnel junction to connect the layers together. The bandgap of the third layer forming the tunnel junction is greater than the bandgap of the first layer so that the third layer is optically inactive. Photons passing through the first layer are not converted into electrical energy and pass unattenuated to the bottom or second layer.

SUMMARY OF THE INVENTION

In accordance with the present invention, power is extracted from photons, plasmons, or other guided electromagnetic waves at infrared to mid-ultraviolet frequencies by means of inelastic tunneling in metal-insulator-semiconductor-metal diodes. The inelastic tunneling process produces power by absorbing the junction plasmons to pump electrons to higher potential. Specifically, an electron from a semiconductor layer absorbs a plasmon and simultaneously tunnels across an insulator into a metal layer which is at higher potential. The diode voltage determines the fraction of energy extracted from the plasmon; any excess is lost to heat.

The apparatus of the present invention operates as a current generator. That is, the operating voltage is produced by the combination of tunneling current and load resistance. Thus, more energy can be extracted from a higher frequency wave by increasing the load or changing the geometry to increase the current. Electrons are raised to higher potential in the metal so that they can do work on the load. Back flow across the insulator is prevented by the bandgap of the semiconductor.

BRIEF DESCRIPTION OF THE DRAWING

The objects advantages, and novel features of the invention will be more fully apparent from the following detailed description when read in connection with the accompanying drawing which is a schematic section view, not to scale, of a metal-insulator-semiconductor-metal diode constructed in accordance with the present invention.

BEST MODE FOR CARRYING OUT THE INVENTION

As shown in the drawing, an inelastic tunnel diode 10 constructed in accordance with the present invention is a sandwich structure comprising a metal film 12, an insulating film 14, semiconductor film 16, and metal film 18. These films are carried by substrate 20 having the configuration of a diffraction grating 22 on the surface that carries these films. A load 24 is connected between the metal film 12 and one of the other conducting layers 16 or 18 if the substrate 20 is a conductor.

Energy is transferred from the external electromagnetic wave into the tunnel diode by means of the grating 22 as described in copending patent application Ser. No. 486,470. The grating period is chosen to cause a mode conversion into a junction plasmon with fields localized in the semiconductor and insulating layers 16 and 14. These electric fields can accelerate electrons as they tunnel across the oxide film 14.

According to the present invention the inelastic tunneling process produces power by absorbing junction plasmons to pump electrons to higher potential. An electron from the semiconductor layer 16 absorbs a plasmon and simultaneously tunnels across the insulator 14 into the metal layer 12 which is at higher potential.

The diode 10 operates as a current generator. That is, the operating voltage is produced by the combination of tunneling current and load resistance. Thus, more energy can be extracted from a higher frequency wave by increasing the load or changing the geometry to increase the current. Electrons are raised to higher potential in the metal 12 so that they can do work on the load 24. Backflow across the insulator 14 is prevented by the bandgap of the semiconductor 16.

In order to support surface or junction plasmons, the metals 12 and 18 must have negative dielectric constants at the frequencies of interest. Preferably, the imaginary part of the dielectric constant is small, indicating weak optical absorption by other mechanisms, such as d-band electronic transitions or ohmic heating. In general, the metals 12 and 18 should be good conductors with high reflectivity at the frequency of interest. Aluminum and silver are preferred in the visible and ultraviolet, but other conductors such as magnesium, indium, silicon, or gold are also contemplated. Certain of these materials may be advantageous for some frequency ranges.

The metal 12 is a thin film having a thickness of approximately a few hundred angstroms. The thickness is a key design parameter which must be optimized for the geometry, wavelength, and materials. In order for photons or surface plasmons to couple into the tunnel diodes, the film thickness should not be much greater than the penetration depth of their electric fields. On the other hand, if the film thickness is much less than the penetration depth of the junction palsmon fields, then the energy will not be localized within the diode and the inelastic tunneling probability will decrease. Also, the efficiency of the grating-coupler will decrease as the surface and junction modes hybridize. Formulas for the various penetration depths are well known in the art.

The insulating film 14 serves as a barrier to enable the conducting layers 12, 16 and 18 to be maintained at different potentials. The barrier height must be greater than the operating voltage, or equivalently, greater than the plasmon energies of interest, which may be as large as 3 to 4 electron volts. Also, the insulating film 14 must be thin, 20-50 angstroms, to facilitate tunneling. Thinner films are preferable, inasmuch as the tunneling probability decreases exponentially with insulator thickness. However, it is difficult to fabricate uniform layers without pin holes much less than 20 to 30 angstroms thick. Native oxides of aluminum are contemplated, inasmuch as they form readily and are self limiting at 30 to 50 angstroms thick. It may be advantageous to use other insulators or even high bandgap semiconductors for the barrier layer. Preferably, the barrier layer should have a low dielectric constant, which improves the junction plasmon range, and should have minimal optical absorption.

In order to prevent backflow, the semiconductor film 16 must have a large bandgap which exceeds the photon energies of interest. Surface states with energies in the bandgap are generally undesirable, inasmuch as they introduce a channel for backflow. However, in some cases, they may be used if they raise the Fermi level to midgap, which is desirable for obtaining high voltage. P+ doping is also contemplated to obtain the desired band bending. Optical absorption is undesirable as are grain boundaries which may scatter the plasmons. For these reasons, single crystals are preferable, although polycrystalline or amorphous materials may be adequate and easier to fabricate.

The thickness of the semiconductor film 16 must be optimized for particular device structures, and it may vary over a broad range. For example, thicknesses on the order of 50 to 55,000 angstroms are contemplated. There is a balance between using thin layers which confine the electric fields thereby improving the probability of plasmon capture by tunneling electrons, or using thicker layers which increase the distance a plasmon can travel before losing its energy to heat. Tapered geometries are contemplated.

The metal layer 18 is typically much thicker than the junction plasmon penetration depth, in which case, the composition of the substrate 20 is unimportant except as it affects materials compatability, durability, and the ease of fabricating grating-couplers. In some designs, the metal 18 may be a thin film on a transparent substrate 20. Such geometries are used for increasing the surface plasmon range, as is well known in the art. This is particularly useful when energy must be distributed to different diodes on a chip, as in the solar energy converter described in copending patent application Ser. No. 486,470.

The diffraction grating 22 is formed in the substrate 20 by standard techniques, such as holography. The grating period is chosen to provide phase-matching between the external electro-magnetic wave and a junction plasmon localized within the diode. Techniques for calculating the grating period are well known in the art; the period depends on geometry, wavelength, and materials. In general, the grating period is in the order of a sixth the optical wavelength, or 0.05 to 0.5 microns for typical devices at solar frequencies. It is not necessary to have a perfectly periodic structure. An irregular surface may be thought of as a set of superimposed gratings of various amplitudes. The external electromagnetic waves scatters off each subgrating independently, but a strong resonance only occurs for the phase-matched component. Deep gratings are contemplated and are expected to be most efficient as long as re-radiation is not allowed kinematically. However, the grating height should generally be optimized for effective mode conversion.

ALTERNATE EMBODIMENTS OF THE INVENTION

The MISM diode 10 responds to plasmons with energy greater than a cut-off determined by the voltage and band bending produced by semiconductor doping and surface states. However, the extracted energy remains proportional to the diode voltage. For spectrum analysis, the doping can be varied for different diodes in an array, or a single diode can be used to scan a spectrum by varying the load electronically. Changes in the external current can be sensed as fluctuations in the operating voltage, or the diode can be self-regulating against current surges which will raise the operating voltage above the plasmon spectrum thereby shutting off the device. Such capabilities are useful in signal-processing.

The grating-coupler can serve as a variable filter for a variety of sensing applications. By way of example, the effective grating period can be changed by rotating the optical beam, or tunable gratings can be formed from sensitive materials, such as piezoelectrics or liquid crystals. A fixed grating can be used to couple or detect different frequency ranges by varying the plasmon mode dispersion. For example, this can be accomplished by tuning the MISM structure through electrostrictive changes in layer thickness, or by varying the refractive index of dielectric overlayers.

While several embodiments of the invention have been shown and described, it will be appreciated that various modifications can be made to the structure without departing from the spirit of the invention or the scope of the subjoined claims. By way of example, the planar sandwich structure can be tapered to provide a gradual transition between geometries optimized for coupling external electromagnetic waves and coupling to tunneling electrons. Also, abrupt nonplanar structures can be used. The grating can have periodic dielectric properties rather than a periodic surface geometry, or localized antennas can be used to provide coupling into the tunnels.

I claim:

1. Apparatus for using plasmons to convert electromagnetic energy to electrical power comprising
    a first conductive film having one surface adapted for receiving incident electromagnetic energy and an opposite surface adapted to face away from said electromagnetic energy, said first conductive film having a configuration of a diffraction grating,
    an insulating film having said diffraction grating configuration covering said opposite surface of said first electrically conducting film,
    a semiconductor film having said diffraction grating configuration covering said insulating film, said diffraction grating configuration having a predetermined period which causes a mode conversion into junction plasmons with fields localized in said semiconductor film and said insulating film by phase-matching between external electromagnetic waves and said junction plasmons,
    a second conductive film having said diffraction grating configuration covering said semiconductor film thereby forming a diode, and
    an electrical load connected between said first and second conductive films.

2. Apparatus as claimed in claim 1 including
    a substrate for carrying said films, said substrate having a surface engaging said second conductive film, said surface having the configuration of said diffraction grating.

3. Apparatus as claimed in claim 2 wherein said substrate is a conductive material.

4. Apparatus as claimed in claim 1 wherein the period of said grating configuration is between about 0.05 microns and 0.5 microns.

5. Apparatus as claimed in claim 1 wherein said first and second conductive films are layers of metal having a negative dielectric constant at predetermined frequencies.

6. Apparatus as claimed in claim 1 wherein said first and said second conductive films are selected from the group consisting essentially of aluminum, silver, magnesium, indium, silicon and gold.

7. Apparatus as claimed in claim 1 wherein the insulating film has a thickness between about 20 angstroms and about 50 angstroms to facilitate tunneling.

8. Apparatus as claimed in claim 7 wherein the insulating film is a layer of a native oxide.

9. Apparatus as claimed in claim 8 wherein the insulating layer is aluminum oxide.

10. Apparatus as claimed in claim 1 wherein the semiconductor film is a single crystal material.

11. Apparatus as claimed in claim 1 wherein the semiconductor layer contains a P+ doping material.

12. Apparatus as claimed in claim 11 wherein the semiconductor layer has a thickness between about 50 angstroms and about 55,000 angstroms.

13. A current generator in electrical communication with a load for extracting energy from photons, plasmons, and other guided electromagnetic waves at infrared to mid-ultraviolet frequencies by inelastic tunneling wherein power is produced by absorbing junction plasmons to pump electrons to high potential, comprising:
a pair of spaced conductive films in electrical contact with said load, a first one of said films having a surface facing away from the other film for receiving incident electromagnetic energy, said surface having a diffraction grating configuration for phase matching incident electromagnetic waves with the junction plasmons,
an insulating film between said conductive films, said insulating film contacting said first one of said conductive films on the surface thereof facing away from said incident energy receiving surface, and
a semiconductor film between said conductive films, said semiconductor film contacting said insulating film and the second one of said conductive films to prevent backflow of electrons.

14. A current generator as claimed in claim 13 including
a substrate for carrying said films, said substrate having a surface in engagement with said second conductive film, said surface having the configuration of said diffraction grating.

15. A current generator as claimed in claim 14 wherein the conductive films are metal.

16. In apparatus for converting sunlight to electricity of the type wherein energy is extracted from photons, plasmons, and other guided electromagnetic waves by dispersing said sunlight over a surface of a conductive member to polarize the surface charge thereon thereby inducing oscillations in the valence electron density at said surface to provide surface plasmons and phase matching photons and surface plasmons of the same energy so that energy is transferred from said photons to said plasmons, the improvement comprising
tunnel diodes for extracting energy from said electromagnetic waves, each of said tunnel diodes having a diffraction grating configuration for phase matching external electromagnetic waves with junction plasmons.

17. Apparatus as claimed in claim 16 wherein each of said tunnel diodes comprises
a pair of spaced conductive films in electrical contact with a load, a first one of said films having a surface adapted to face toward said sunlight and an opposite surface adapted to face away from said sunlight, said films having the diffraction grating configuration,
an insulating film between said conductive films, said insulating film contacting said first one of said conductive films on said opposite surface thereof, and
a semiconductor film between said conductive films, said semiconductor film contacting said insulating film and the second one of said conductive films.

18. Apparatus as claimed in claim 17 wherein the spaced conductive films are metal layers having a thickness of approximately a few hundred angstroms.

* * * * *